US012635154B2

(12) United States Patent
Adachi et al.

(10) Patent No.: US 12,635,154 B2
(45) Date of Patent: May 19, 2026

(54) SEMICONDUCTOR DEVICE HAVING SCHOTTKY BARRIER DIODE AND P-N JUNCTION DIODE

(71) Applicants:Kabushiki Kaisha Toshiba, Tokyo (JP); Toshiba Electronic Devices & Storage Corporation, Tokyo (JP)

(72) Inventors: Yuto Adachi, Ibo Hyogo (JP); Yoichi Hori, Himeji Hyogo (JP); Makoto Mizukami, Ibo Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 488 days.

(21) Appl. No.: 18/108,089

(22) Filed: Feb. 10, 2023

(65) Prior Publication Data

US 2024/0097045 A1    Mar. 21, 2024

(30) Foreign Application Priority Data

Sep. 20, 2022    (JP) ................................. 2022-148898

(51) Int. Cl.
*H10D 8/60*        (2025.01)
*H10D 8/00*        (2025.01)
        (Continued)

(52) U.S. Cl.
CPC .............. *H10D 8/60* (2025.01); *H10D 8/411* (2025.01); *H10D 62/126* (2025.01); *H10D 62/8325* (2025.01)

(58) Field of Classification Search
CPC ............. H10D 62/126; H10D 62/8325; H10D 62/105; H10D 62/106; H10D 8/60–605;
        (Continued)

(56) References Cited

U.S. PATENT DOCUMENTS 11,271,118 B2    3/2022  Ohse et al.
11,929,400 B2*   3/2024  Ohse ..................... H10D 62/106
        (Continued)

FOREIGN PATENT DOCUMENTS

JP          2000-261004 A        9/2000
JP          2010-0225914         10/2010
        (Continued)

OTHER PUBLICATIONS

Office Action issued in Japanese Patent Application No. 2022-148898, dated Jun. 27, 2025 in 15 pages.

*Primary Examiner* — Shahed Ahmed
(74) *Attorney, Agent, or Firm* — Knobbe, Martens, Olson & Bear, LLP

(57)        ABSTRACT

A semiconductor device includes a first electrode, a first semiconductor layer of a first conductivity type located on the first electrode, a second semiconductor layer of a second conductivity type located on a portion of the first semiconductor layer, a metal layer located on the first and second semiconductor layers, a second electrode located on the metal layer, a bonding member connected to an upper surface of the second electrode, and a conductive member located between the second semiconductor layer and the metal layer. The metal layer has a Schottky junction with the first semiconductor layer. The conductive member is made of a different material from the metal layer. An area ratio of the conductive member in a region directly under the bonding member is higher than an area ratio of the conductive member in a region other than the region directly under the bonding member.

19 Claims, 9 Drawing Sheets

(51) Int. Cl.
H10D 62/10 (2025.01)
H10D 62/832 (2025.01)

(58) Field of Classification Search
CPC ........... H01L 24/05; H01L 2224/04042; H01L
23/49811–49816; H01L
2224/48155–48165; H01L
2224/48225–4824
See application file for complete search history.

(56) References Cited

U.S. PATENT DOCUMENTS

| | | | |
|---|---|---|---|
| 2012/0241762 A1 | 9/2012 | Noda et al. | |
| 2015/0001552 A1 | 1/2015 | Hori et al. | |
| 2016/0276442 A1 | 9/2016 | Oota et al. | |
| 2018/0061951 A1* | 3/2018 | Kitamura ............. | H10D 62/126 |
| 2021/0328025 A1 | 10/2021 | Ohse et al. | |
| 2021/0376168 A1 | 12/2021 | Tanihira et al. | |
| 2021/0391437 A1 | 12/2021 | Ohse | |

FOREIGN PATENT DOCUMENTS

| | | |
|---|---|---|
| JP | 2012-204411 A | 10/2012 |
| JP | 2015-29046 A | 2/2015 |
| JP | 2015-057843 A | 3/2015 |
| JP | 2016-171293 A | 9/2016 |
| JP | 2018-032794 A | 3/2018 |
| JP | 2021-044272 A | 3/2021 |
| JP | 2021-197420 A | 12/2021 |
| WO | 2021-019888 A1 | 2/2021 |

* cited by examiner

SEMICONDUCTOR DEVICE HAVING SCHOTTKY BARRIER DIODE AND P-N JUNCTION DIODE

CROSS-REFERENCE TO RELATED APPLICATIONS

This application is based upon and claims the benefit of priority from Japanese Patent Application No. 2022-148898, filed on Sep. 20, 2022; the entire contents of which are incorporated herein by reference.

FIELD

Embodiments relate to a semiconductor device.

BACKGROUND

In recent years, Schottky barrier diodes (SBDs) that use silicon carbide (SiC), which is a wide-gap semiconductor, are being developed. To increase the surge current tolerance in a SBD, technology has been proposed in which a p-n junction diode is provided inside the SBD.

DETAILED DESCRIPTION

In general, according to one embodiment, a semiconductor device includes a first electrode, a first semiconductor layer located on the first electrode, a second semiconductor layer located on a portion of the first semiconductor layer, a metal layer located on the first semiconductor layer and on the second semiconductor layer, a second electrode located on the metal layer, a bonding member connected to an upper surface of the second electrode, and a conductive member located between the second semiconductor layer and the metal layer. The first semiconductor layer is of a first conductivity type. The second semiconductor layer is of a second conductivity type. The metal layer has a Schottky junction with the first semiconductor layer. The conductive member is made of a different material from the metal layer.

An area ratio of the conductive member in a region directly under the bonding member is higher than an area ratio of the conductive member in a region other than the region directly under the bonding member.

First Embodiment

Figure 1:
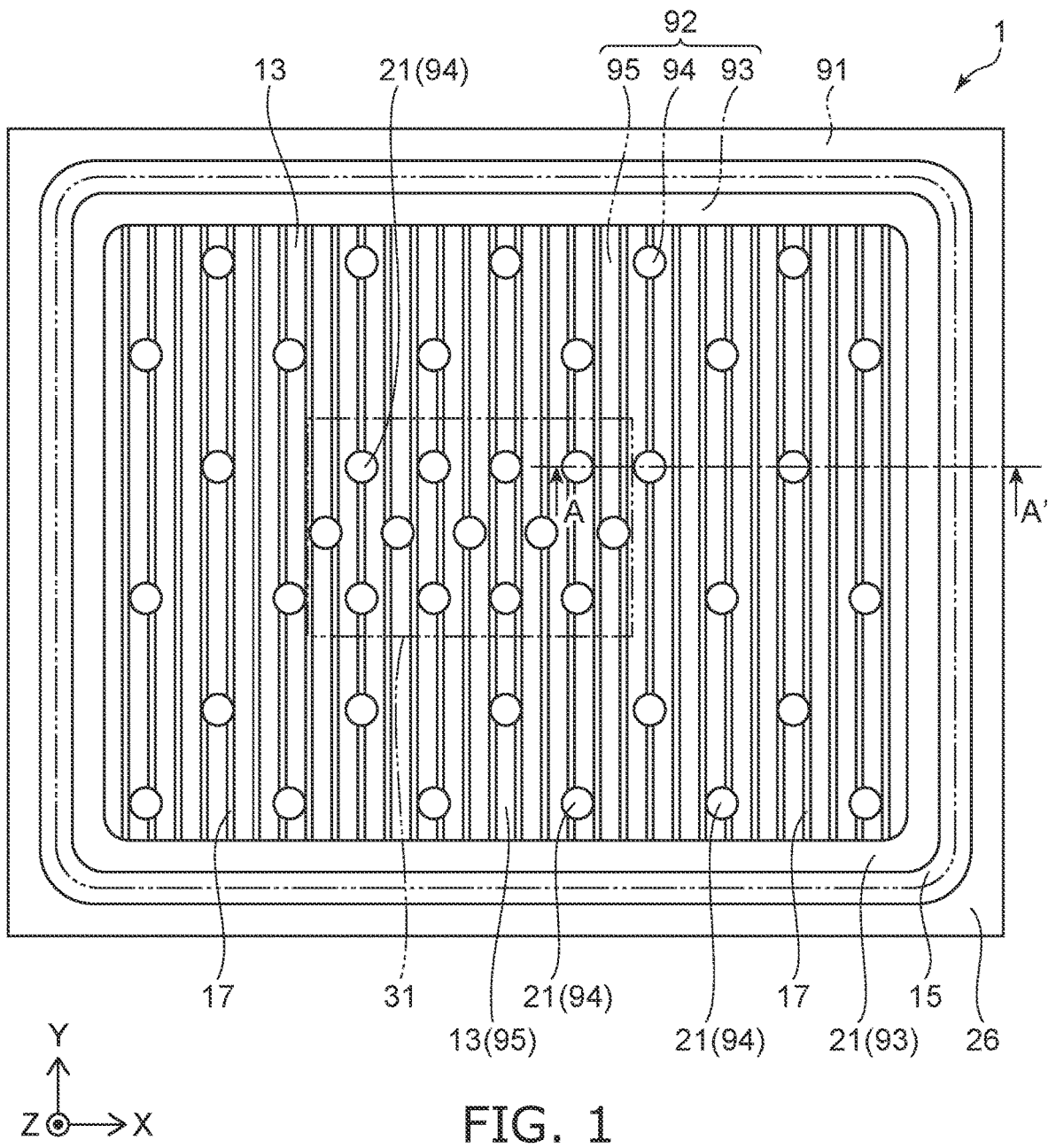
FIG. 1 is a top view showing a semiconductor device according to a first embodiment.

FIG. 1 is a top view showing a semiconductor device according to the embodiment.

Figure 2:
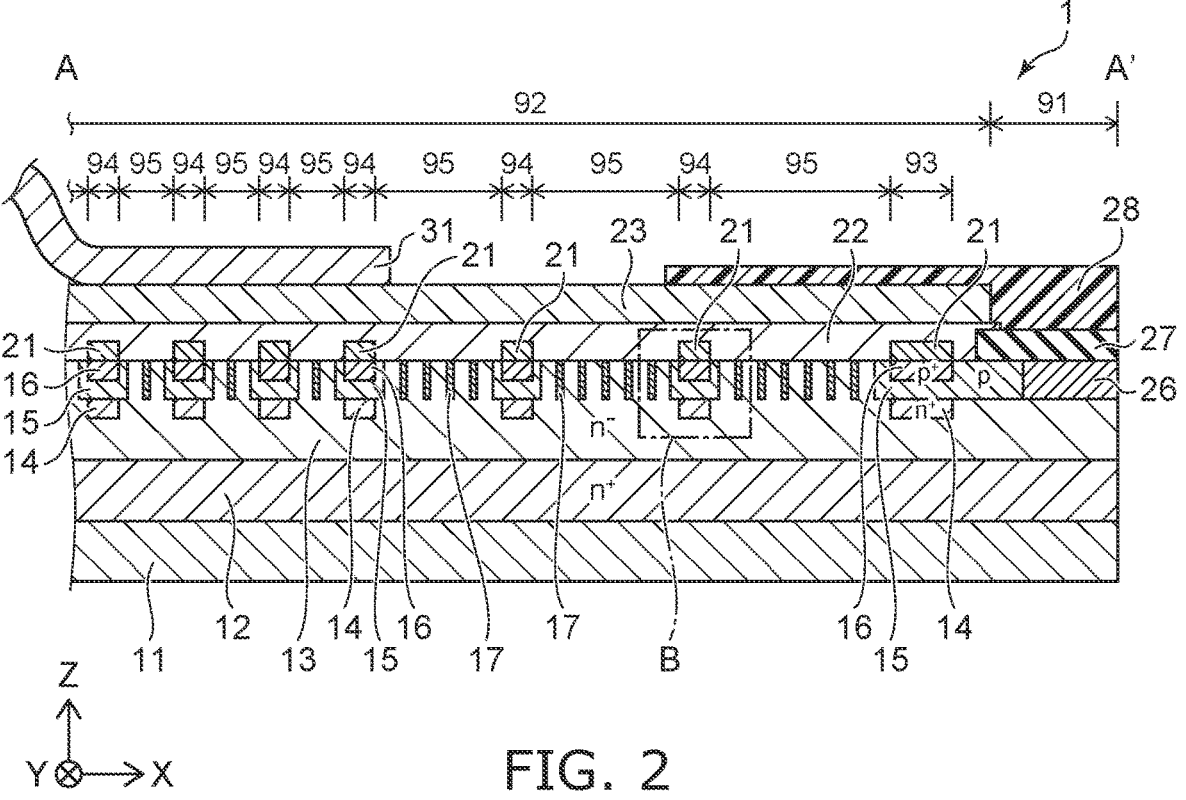
FIG. 2 is a cross-sectional view along line A-A' shown in FIG. 1.

FIG. 2 is a cross-sectional view along line A-A' shown in FIG. 1.

Figure 3:
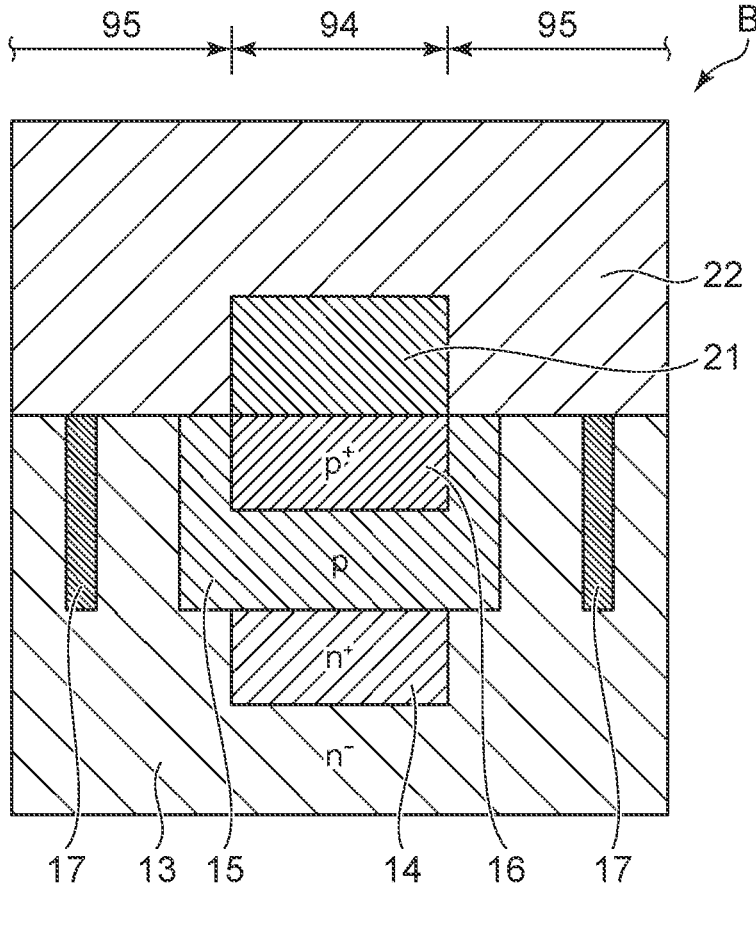
FIG. 3 is a partially enlarged cross-sectional view showing region B of FIG. 2.

FIG. 3 is a partially enlarged cross-sectional view showing region B of FIG. 2.

The drawings are schematic or conceptual, and are enhanced or simplified as appropriate for easier viewing of the drawing. For example, in FIG. 1, a metal layer 22 and an anode electrode 23 are not illustrated, and the outer edge of a bonding member 31 is shown by a double dot-dash line. P-type stripe layers 17 are drawn wider and fewer in number than in an actual configuration for easier viewing of the drawings. The dimensional ratios and/or numbers are not necessarily the same between drawings, the even for identical components. For example, the numbers of the p-type stripe layers 17 and conductive members 21 do not match respectively between FIGS. 1 and 2. This is similar for the other drawings described below as well.

As shown in FIGS. 1 to 3, the semiconductor device 1 according to the embodiment includes a cathode electrode 11, an $n^+$-type semiconductor substrate 12, an $n^-$-type drift layer 13, multiple $n^+$-type layers 14 of the $n^+$-type, multiple p-type layers of the p-type, multiple $p^+$-type layers 16 of the $p^+$-type, multiple p-type stripe layers 17 of the p-type, the multiple conductive members 21, the metal layer 22, the anode electrode 23, a RESURF layer 26, an insulating layer 27, a protective film 28, and the bonding member 31.

The "$n^+$-type" refers to a higher carrier concentration than the "n-type"; and the "$n^-$-type" refers to a lower carrier concentration than the "n-type". This is similar for the p-type as well. The "carrier concentration" refers to the effective impurity concentration functioning as a donor or acceptor.

An XYZ orthogonal coordinate system is employed for convenience of description in the specification. The arrangement direction of the cathode electrode 11 and the anode electrode 23 is taken as a "Z-direction"; the direction in which the p-type stripe layers 17 extend is taken as a "Y-direction"; and the arrangement direction of the multiple p-type stripe layers 17 is taken as an "X-direction". Among the Z-directions, a direction that is from the cathode electrode 11 toward the anode electrode 23 also is called "up", and the opposite direction also is called "down", but these expressions are for convenience and are independent of the direction of gravity. "When viewed from above" means a depiction of the configuration in any XY plane.

The overall shape of the semiconductor device 1 is, for example, a rectangular parallelepiped. Several regions are set in the semiconductor device 1 when viewed from above. The outer perimeter part of the semiconductor device 1 when viewed from above is a termination region 91. The termination region 91 is a frame-shaped region that includes the outer edge of the semiconductor device 1. A substantially rectangular region surrounded with the termination region 91 is a cell region 92. A frame-shaped outer perimeter p-i-n region 93, multiple island-shaped p-i-n regions 94 (first regions), and a SBD region 95 (a second region) are set in the cell region 92.

The outer perimeter p-i-n region 93 is located along the outer perimeter of the cell region 92 and is substantially frame-shaped. The multiple island-shaped p-i-n regions 94 are separated from each other in the region surrounded with the outer perimeter p-i-n region 93. Each island-shaped p-i-n region 94 is, for example, circular or polygonal such as quadrilateral, octagonal, etc. According to the embodiment, the sizes and shapes are respectively the same between the multiple island-shaped p-i-n regions 94. The region of the cell region 92 other than the outer perimeter p-i-n region 93 and the island-shaped p-i-n regions 94 is the SBD region 95.

The components of the semiconductor device 1 will now be described.

The cathode electrode 11 is provided over the entire or substantially the entire lower surface of the semiconductor device 1. The cathode electrode 11 is located in at least the entire cell region 92 and may be located in at least a portion of the termination region 91 as well. The cathode electrode 11 is made of a metal, e.g., nickel (Ni).

The semiconductor substrate 12 is located on the cathode electrode 11 and connected to the cathode electrode 11. In the specification, "connected" refers to an electrical connection. The semiconductor substrate 12 is located in the entire semiconductor device 1 when viewed from above. The semiconductor substrate 12 is made of a semiconductor material, e.g., single-crystal silicon carbide (SiC). As described above, the conductivity type of the semiconductor substrate 12 is the $n^+$-type.

The drift layer 13 is located on the semiconductor substrate 12 and contacts the semiconductor substrate 12. As described above, the conductivity type of the drift layer 13 is the $n^-$-type. The drift layer 13 is located in the entire semiconductor device 1 when viewed from above.

The $n^+$-type layer 14 is located on a portion of the drift layer 13 and contacts the drift layer 13. The $n^+$-type layer 14 is located in the outer perimeter p-i-n region 93 and the island-shaped p-i-n region 94 but is not located in the SBD region 95. A first semiconductor layer includes the $n^+$-type semiconductor substrate 12, the $n^-$-type drift layer 13, and the multiple $n^+$-type layers 14.

The p-type layer 15 is located in a region that includes the region directly above the $n^+$-type layer 14; and the p-type layer 15 contacts the $n^+$-type layer 14. The p-type layer 15 is located in the entire outer perimeter p-i-n region 93, the entire island-shaped p-i-n region 94, and the region at the periphery of the outer perimeter p-i-n region 93 and the island-shaped p-i-n region 94.

The $p^+$-type layer 16 is located on the p-type layer 15 in the region directly above the $n^+$-type layer 14. The side surface and lower surface of the $p^+$-type layer 16 contact the p-type layer 15. A second semiconductor layer includes the p-type layer 15 and the $p^+$-type layer 16.

The p-type stripe layer 17 (a third semiconductor layer) is located on another portion of the drift layer 13. The lower surface and side surface of each p-type stripe layer 17 contact the drift layer 13. The p-type stripe layers 17 are located in a portion of the SBD region 95. The multiple p-type stripe layers 17 are arranged along the X-direction; and each p-type stripe layer 17 extends in the Y-direction. For example, the multiple p-type stripe layers 17 are periodically arranged. However, the p-type layers 15 are provided in regions where the p-type stripe layers 17 cross the p-type layers 15.

The drift layer 13, the $n^+$-type layer 14, the p-type layer 15, the $p^+$-type layer 16, the p-type stripe layer 17, and the RESURF layer 26 are made of semiconductor materials and include, for example, silicon carbide epitaxially grown on the semiconductor substrate 12 and impurities ion-implanted into the silicon carbide.

The conductive member 21 is located in the region directly above the $p^+$-type layer 16 and contacts the $p^+$-type layer 16. In other words, the conductive member 21 is located in the outer perimeter p-i-n region 93 and the island-shaped p-i-n region 94 but is not located in the SBD region 95. The conductive member 21 is formed of a different conductive material from the metal layer 22 described below, and is formed of, for example, nickel silicide (NiSi). The conductive member 21 has an ohmic connection with the $p^+$-type layer 16.

The metal layer 22 is located on the drift layer 13, on the p-type layer 15, on the p-type stripe layer 17, and on the conductive member 21 and contacts the drift layer 13, the p-type layer 15, the p-type stripe layer 17, and the conductive member 21. The metal layer 22 is located in the entire cell region 92. The metal layer 22 is formed of a metal material that has a Schottky junction with the drift layer 13, e.g., titanium (Ti) or vanadium (V).

The anode electrode 23 is located on the metal layer 22 and contacts the metal layer 22. Thereby, the anode electrode 23 is connected to the metal layer 22 and the conductive member 21. The anode electrode 23 is located in the entire cell region 92 but is not located in the termination region 91. The anode electrode 23 is made of, for example, a metal, e.g., aluminum (Al) or copper-aluminum alloy (AlCu).

The bonding member 31 is bonded to a portion of the upper surface of the anode electrode 23. For example, the bonding member 31 is located at the central portion of the cell region 92. According to the embodiment, the bonding member 31 is larger than each island-shaped p-i-n region 94 and larger than the width of each p-type stripe layer 17 when viewed from above. Therefore, the bonding member 31 is provided over multiple island-shaped p-i-n regions 94 and multiple p-type stripe layers 17. The bonding member 31 is made of, for example, a metal, e.g., aluminum or gold (Au).

The RESURF layer 26, the insulating layer 27, and the protective film 28 are located in the termination region 91. The RESURF layer 26 is located on the drift layer 13 and has substantially the same Z-direction position as the p-type layer 15. The RESURF layer 26 is a layer provided with p-conductivity by ion-implanting aluminum, boron (B), etc., into silicon carbide. The insulating layer 27 is located on the RESURF layer 26. The insulating layer 27 is made of an insulating material, e.g., silicon dioxide ($SiO_2$). The lower surface of the insulating layer 27 contacts the RESURF layer 26 and the p-type layer 15; and the metal layer 22 contacts the side surface of the insulating layer 27 at the cell region 92 side and the region of the upper surface of the insulating layer 27 at the cell region 92 side. The protective film 28 is located on the insulating layer 27 and on the portion of the anode electrode 23 at the termination region 91 side. The protective film 28 is made of an insulating material, e.g., a resin material, e.g., polyimide.

In the island-shaped p-i-n region 94 as shown in FIG. 3, a p-n junction-type diode is formed by stacking the $n^-$-type drift layer 13, the $n^+$-type layer 14, the p-type layer 15, and the $p^+$-type layer 16 in this order from the cathode electrode 11 side toward the anode electrode 23 side. The drift layer 13 is connected to the cathode electrode 11 via the $n^+$-type semiconductor substrate 12. The $p^+$-type layer 16 is connected to the anode electrode 23 via the conductive member 21 and the metal layer 22. This is similar in the outer perimeter p-i-n region 93 as well.

The positions of the $n^+$-type layer 14, the $p^+$-type layer 16, and the conductive member 21 correspond to the outer perimeter p-i-n region 93 and the island-shaped p-i-n region 94 when viewed from above. In other words, the $n^+$-type layer 14, the $p^+$-type layer 16, and the conductive member 21 are located in the entire outer perimeter p-i-n region 93 and the entire island-shaped p-i-n region 94 but are not located in other regions.

In the SBD region 95, the drift layer 13 contacts the metal layer 22. A Schottky barrier diode is formed of the drift layer 13 and the metal layer 22 because the drift layer 13 and the metal layer 22 have a Schottky junction. In the SBD region 95, the multiple p-type stripe layers 17 also contact the metal layer 22. Thereby, the depletion layer that is formed when reverse-biased is displaced toward the cathode electrode 11 side, and concentration of the electric field at the interface between the drift layer 13 and the metal layer 22 can be suppressed.

In the semiconductor device 1 as shown in FIGS. 1 and 2, the arrangement density of the island-shaped p-i-n regions 94 in the region directly under the bonding member 31 is greater than the arrangement density of the island-shaped p-i-n regions 94 in the region other than the region directly under the bonding member 31. More specifically, the sizes and shapes are respectively the same between the multiple island-shaped p-i-n regions 94 located in the cell region 92, but the distance between adjacent island-shaped p-i-n regions 94 in the region directly under the bonding member 31 is less than the distance between adjacent island-shaped p-i-n regions 94 in the region other than the region directly under the bonding member 31. As a result, the area ratio of the island-shaped p-i-n region 94 in the region directly under the bonding member 31 is greater than the area ratio of the island-shaped p-i-n region 94 in the region other than the region directly under the bonding member 31. "Region directly under the bonding member 31" is the region that is lower than the bonding member 31 and overlaps the bonding member 31 when viewed from above.

In other words, the arrangement density of the conductive members 21 in the region directly under the bonding member 31 is greater than the arrangement density of the conductive members 21 in the region other than the region directly under the bonding member 31. Therefore, the area ratio of the conductive member 21 in the region directly under the bonding member 31 is greater than the area ratio of the conductive member 21 in the region other than the region directly under the bonding member 31. The area ratio of the conductive member 21 may decrease in stages away from the region directly under the bonding member 31.

The region directly under the bonding member 31 corresponds to the central region of the cell region 92 when viewed from above. The central region of the cell region 92 is a region that includes the center of the cell region 92. When the cell region 92 is rectangular, the center of the cell region 92 is at the intersection of diagonal lines of the cell region 92. The peripheral region of the cell region 92 is a frame-shaped region of the region surrounded with the outer perimeter p-i-n region 93 that contacts the outer perimeter p-i-n region 93. The peripheral region may be in contact with or separated from the central region. The area ratio of the conductive member 21 in the central region of the cell region 92 is greater than the area ratio of the conductive member 21 in the peripheral region of the cell region 92. In other words, at least the central region, the peripheral region, and the outer perimeter p-i-n region 93 are included in the cell region 92; and the island-shaped p-i-n region 94 and the SBD region 95 exist in both the central region and the peripheral region.

Operations of the semiconductor device 1 according to the embodiment will now be described.

First, a normal operation will be described.

In the semiconductor device 1 shown in FIG. 2, when a higher potential than that of the cathode electrode 11 is applied to the anode electrode 23, a Schottky barrier diode formed by the metal layer 22 and the drift layer 13 conducts in the SBD region 95; and a current flows from the anode electrode 23 toward the cathode electrode 11. Thereby, the semiconductor device 1 is in the conducting state. On the other hand, when a higher potential than that of the anode electrode 23 is applied to the cathode electrode 11, a depletion layer spreads inside the drift layer 13 with the interface between the metal layer 22 and the drift layer 13 as a starting point; and the Schottky barrier diode becomes nonconducting. Thereby, the semiconductor device 1 is in a nonconducting state. Thus, the semiconductor device 1 functions as a diode.

Cases where a surge current is applied and effects of the embodiment will now be described.

Figure 4A:
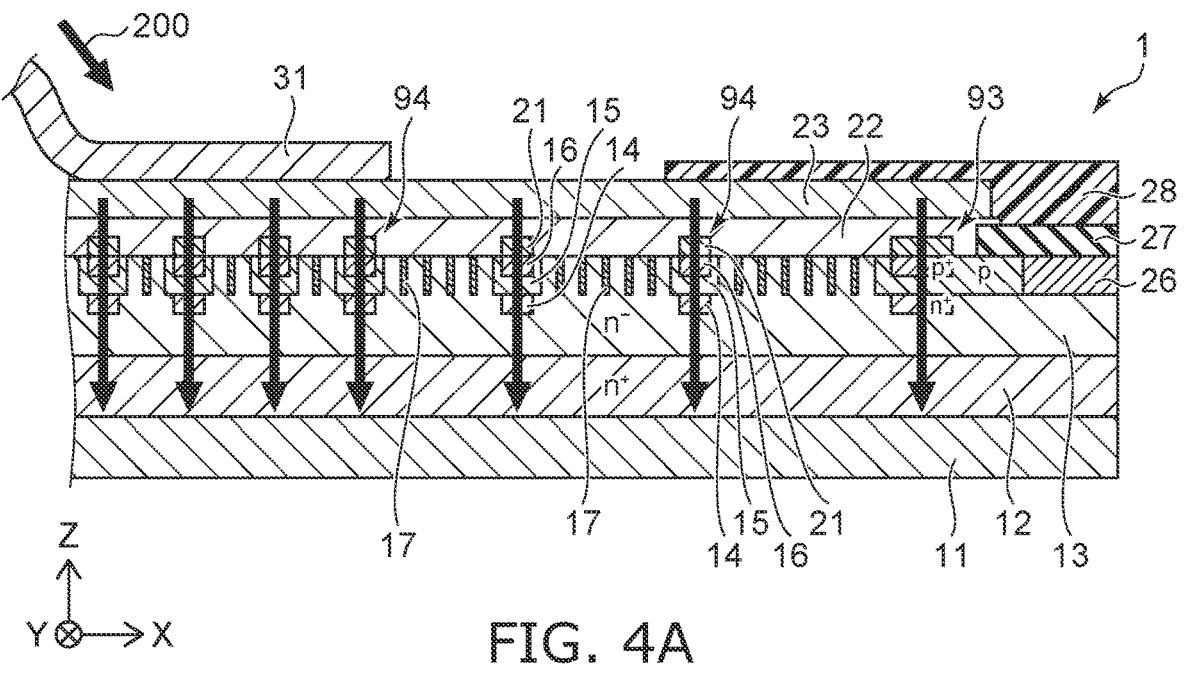
FIG. 4A shows a case where a forward surge current is applied to the semiconductor device according to the first embodiment.
Figure 4B:
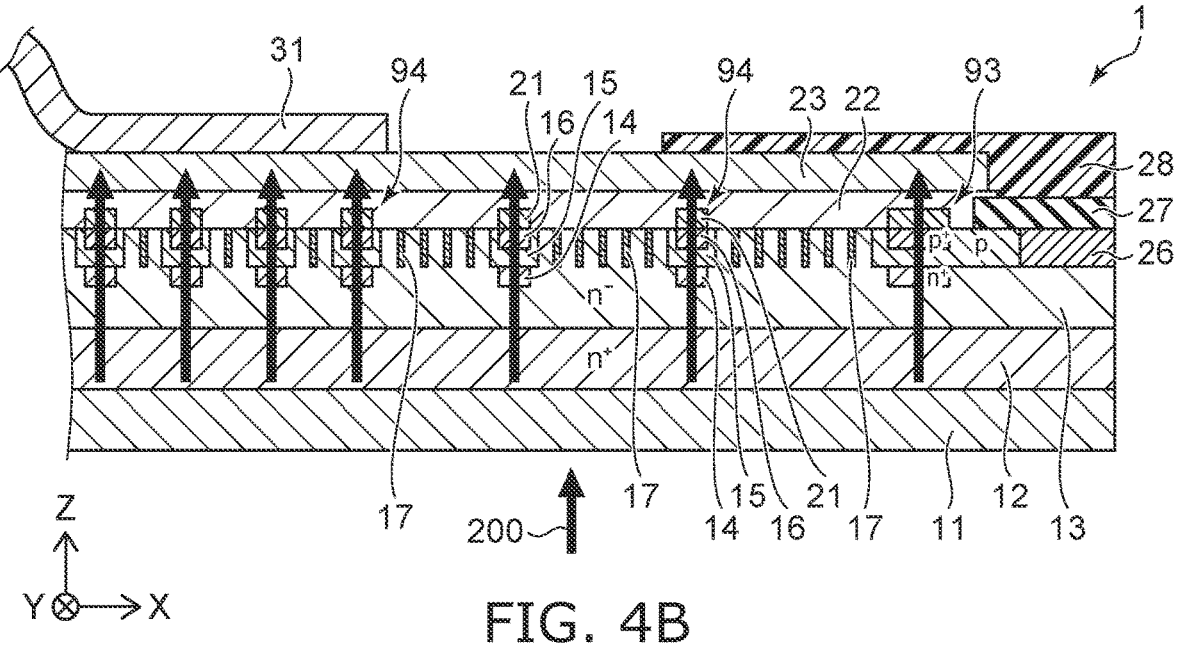
FIG. 4B shows a case where a reverse surge current is applied thereto.

FIG. 4A shows the case where a forward surge current is applied to the semiconductor device according to the embodiment; and FIG. 4B shows the case where a reverse surge current is applied.

As shown in FIG. 4A, when a positive-potential surge current 200 flows into the semiconductor device 1 via the bonding member 31, the surge current 200 is a forward surge current 200 of the semiconductor device 1. In such a case, a p-n junction-type diode that is formed of the $n^-$-type drift layer 13, the $n^+$-type layer 14, the p-type layer 15, and the $p^+$-type layer 16 in the island-shaped p-i-n region 94 and the outer perimeter p-i-n region 93 conducts. Thereby, the surge current 200 is caused to flow from the anode electrode 23 to the cathode electrode 11 via the p-n junction-type diode and is discharged outside the semiconductor device 1.

In such a case, the arrangement density of the island-shaped p-i-n regions 94 is higher in the region directly under the bonding member 31 than in the region other than the region directly under the bonding member 31; therefore, for the same current amount flowing through each island-shaped p-i-n region 94, much current can flow in the region directly under the bonding member 31. Thereby, the surge current 200 that concentrates in the region directly under the bonding member 31 can effectively flow, and damage of the semiconductor device 1 can be suppressed.

As shown in FIG. 4B, when a positive-potential surge current 200 flows into the semiconductor device 1 via the cathode electrode 11, the surge current 200 is a reverse surge current 200 of the semiconductor device 1. In such a case, avalanche breakdown of the p-n junction-type diode occurs in the island-shaped p-i-n region 94 and the outer perimeter p-i-n region 93. Thereby, the surge current 200 is caused to flow from the cathode electrode 11 to the anode electrode 23 via the p-n junction-type diode. The surge current 200 that flows into the anode electrode 23 is discharged outside the semiconductor device 1 via the bonding member 31.

In such a case as well, the arrangement density of the island-shaped p-i-n regions 94 is higher in the region directly under the bonding member 31 than in the region other than the region directly under the bonding member 31; therefore, the surge current 200 that concentrates in the region directly under the bonding member 31 can efficiently flow out of the semiconductor device 1. Accordingly, damage of the semiconductor device 1 can be suppressed.

Thus, the surge current 200 concentrates in the region directly under the bonding member 31. According to the embodiment, the area ratio of the island-shaped p-i-n region 94 in the region directly under the bonding member 31 is greater than the area ratio of the island-shaped p-i-n region 94 in the region other than the region directly under the bonding member 31. Thereby, the surge current 200 that concentrates in the region directly under the bonding member 31 flows effectively, and damage of the semiconductor device 1 can be suppressed.

On the other hand, the area ratio of the island-shaped p-i-n region 94 is low in the region other than the region directly under the bonding member 31. A low forward voltage in the normal operation can be maintained thereby.

Comparative Example

Figure 5:
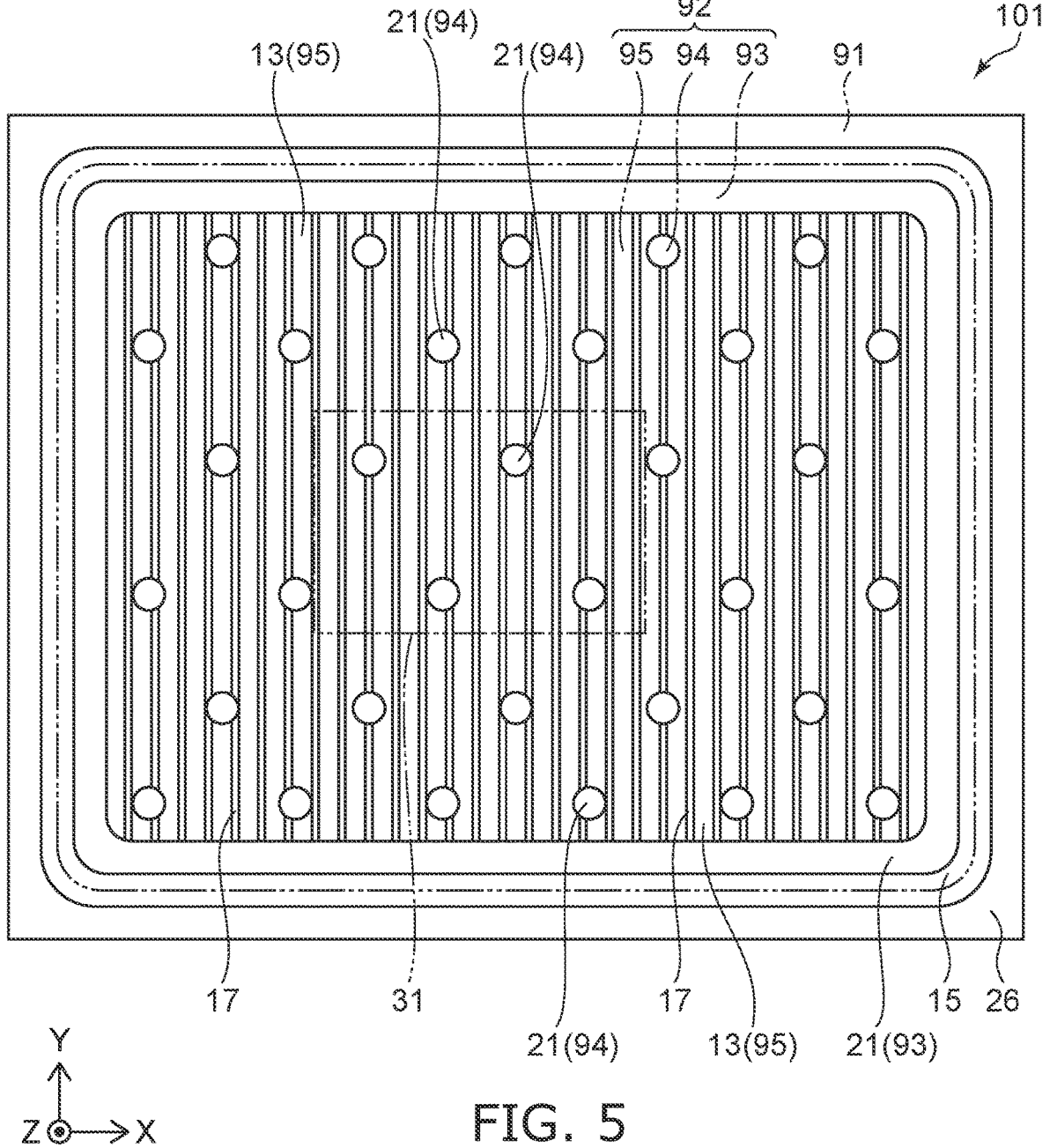
FIG. 5 is a top view showing a semiconductor device according to a comparative example.

FIG. 5 is a top view showing a semiconductor device according to the comparative example.

Figure 6A:
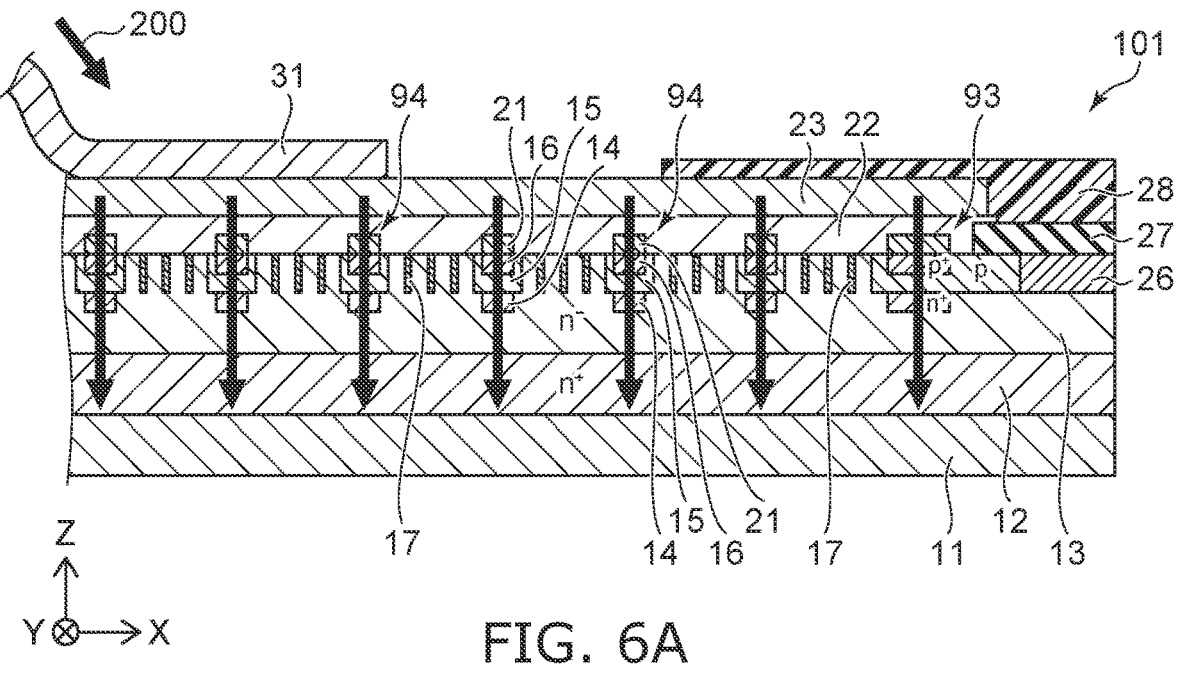
FIG. 6A shows a case where a forward surge current is applied to the semiconductor device according to the comparative example.
Figure 6B:
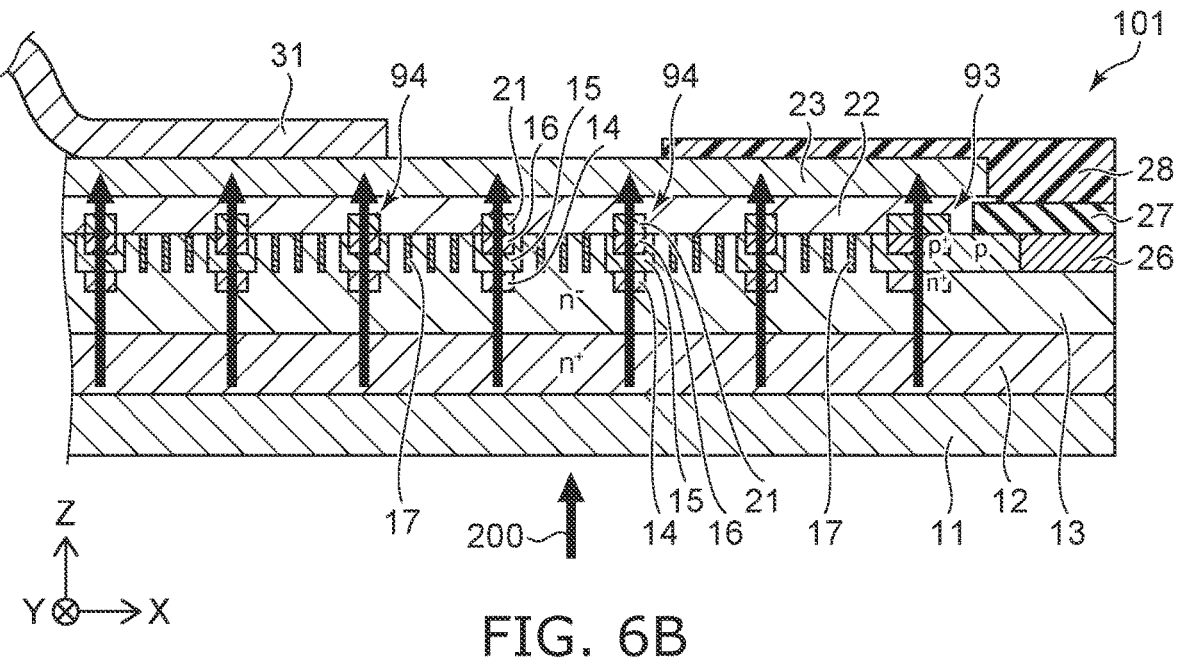
FIG. 6B shows a case where a reverse surge current is applied thereto.

FIG. 6A shows the case where a forward surge current is applied to the semiconductor device according to the comparative example; and FIG. 6B shows the case where a reverse surge current is applied.

As shown in FIG. 5, the island-shaped p-i-n regions 94 are uniformly located in the semiconductor device 101 according to the comparative example. In other words, the sizes and shapes are respectively the same between the island-shaped p-i-n regions 94; and the island-shaped p-i-n regions 94 are periodically arranged along the X-direction and the Y-direction. Therefore, the area ratio of the island-shaped p-i-n region 94 in the region directly under the bonding member 31 is substantially equal to the area ratio of the island-shaped p-i-n region 94 in the region other than the region directly under the bonding member 31.

As shown in FIGS. 6A and 6B, when the surge current 200 flows into the semiconductor device 101, the forward surge current 200 flows into the semiconductor device 101 via the bonding member 31. The reverse surge current 200 flows out from the semiconductor device 101 via the bonding member 31. At this time, the anode electrode 23 has resistance in the direction along the XY plane; therefore, the surge current 200 is not easily diffused along the XY plane by the anode electrode 23, and concentrates in the region directly under the bonding member 31. On the other hand, the ability of each island-shaped p-i-n region 94 to pass the surge current 200 is the same between the region directly under the bonding member 31 and the region other than the region directly under the bonding member 31. Therefore, the current density in the region directly under the bonding member 31 becomes high, and thermal destruction easily occurs.

In contrast, in the semiconductor device 1 according to the first embodiment, the area ratio of the island-shaped p-i-n region 94 in the region directly under the bonding member 31 is high; therefore, the surge current 200 that concentrates can effectively flow. As a result, thermal destruction does not easily occur.

Second Embodiment

Figure 7:
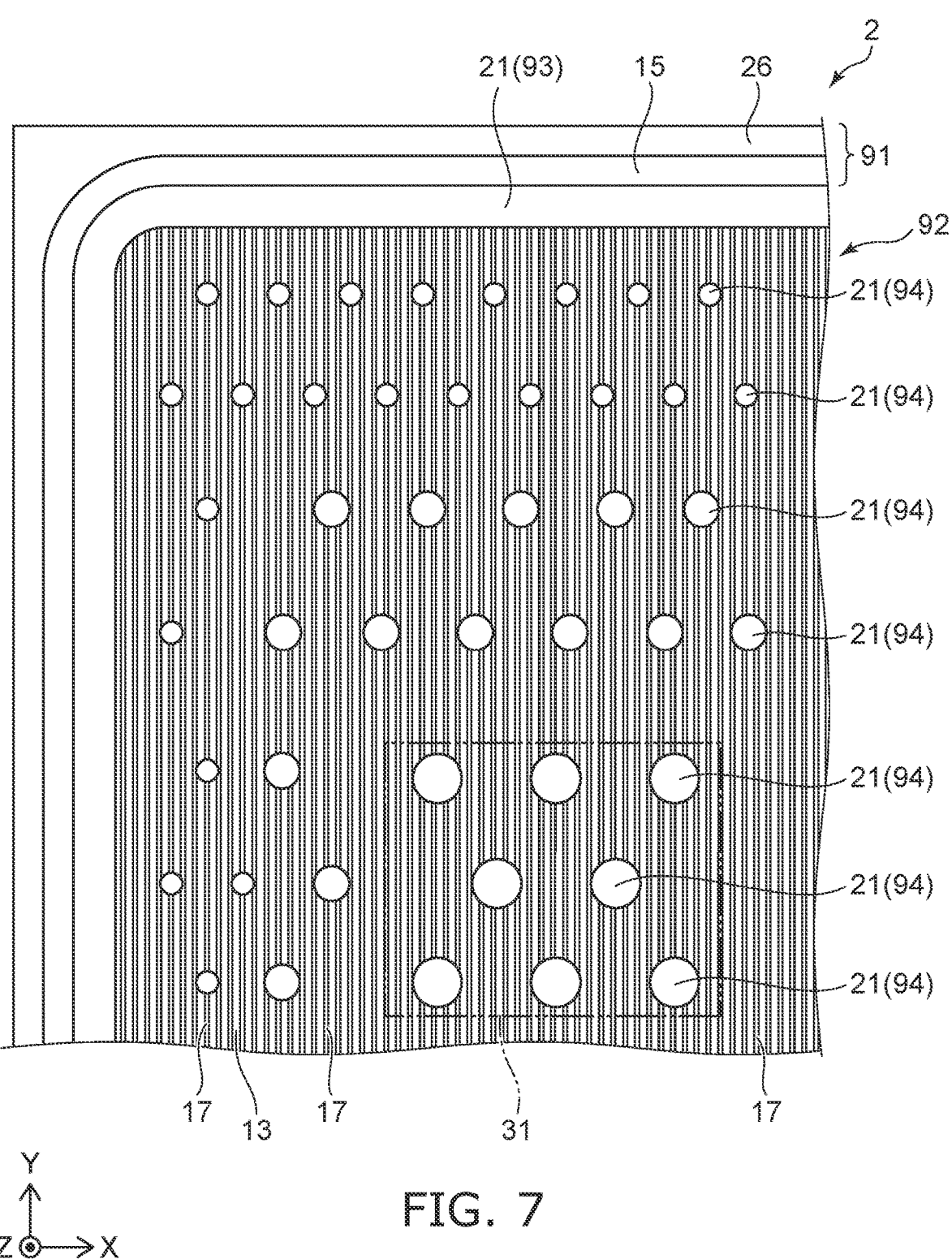
FIG. 7 is a top view showing a semiconductor device according to a second embodiment.

FIG. 7 is a top view showing a semiconductor device according to the embodiment.

Figure 8A:
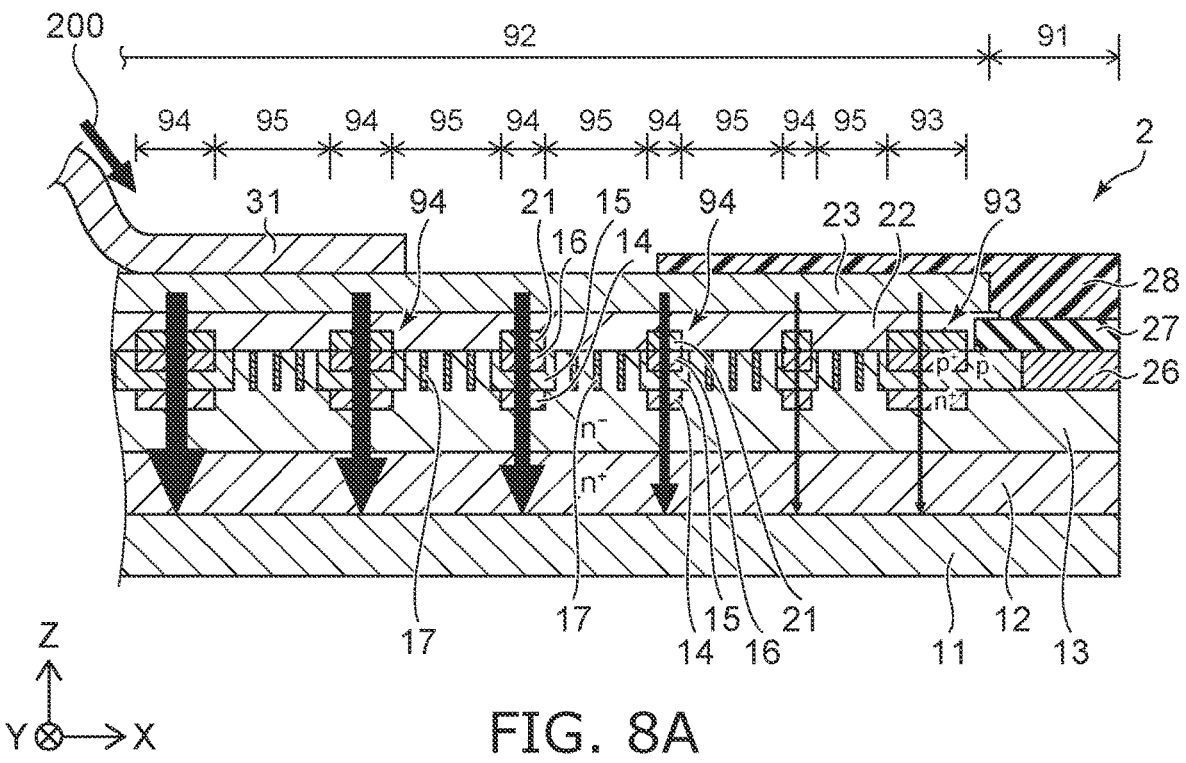
FIG. 8A shows a where a forward surge current is applied to the semiconductor device according to the second embodiment.
Figure 8B:
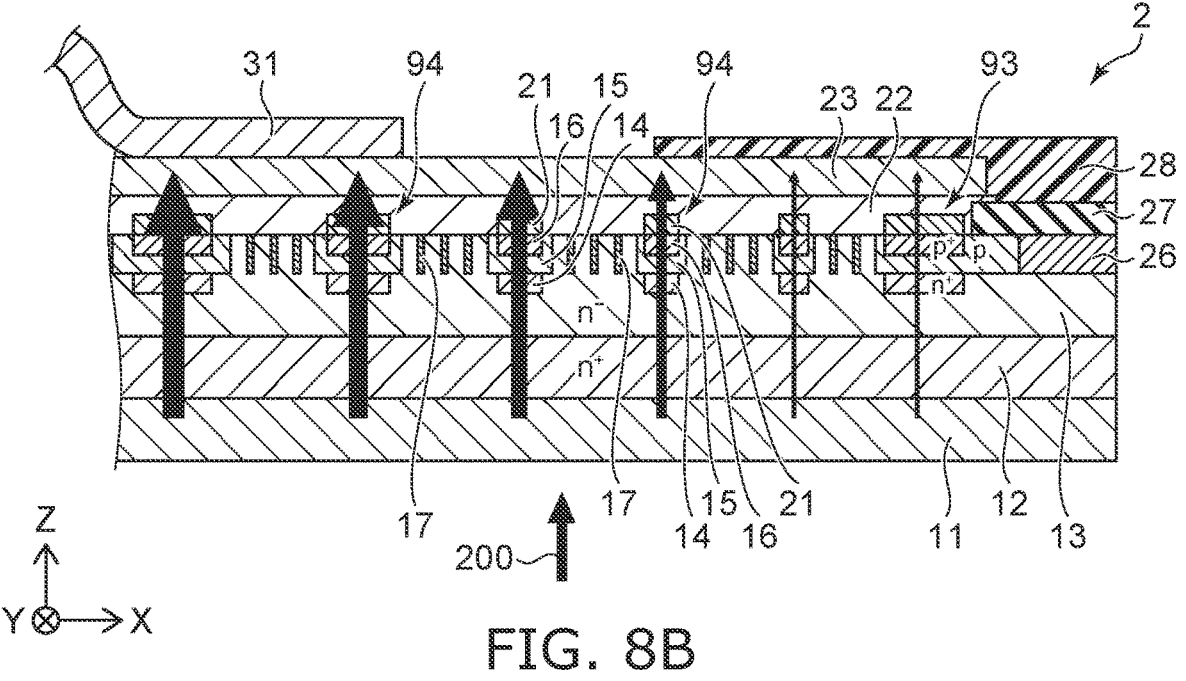
FIG. 8B shows a case where a reverse surge current is applied thereto.

FIG. 8A shows the case where a forward surge current is applied to the semiconductor device according to the embodiment; and FIG. 8B shows the case where a reverse surge current is applied.

In the semiconductor device 2 according to the embodiment as shown in FIG. 7, the island-shaped p-i-n regions 94 that are located in the region directly under the bonding member 31 are larger than the island-shaped p-i-n regions 94 located in the region other than the region directly under the bonding member 31. More specifically, the island-shaped p-i-n regions 94 that are located in the region directly under the bonding member 31 are largest, and the island-shaped p-i-n regions 94 that are located in the outer perimeter part of the cell region 92 are smallest. The island-shaped p-i-n regions 94 are larger closer to the region directly under the bonding member 31. Thus, the island-shaped p-i-n regions 94 gradually become larger toward the region directly under the bonding member 31.

On the other hand, according to the embodiment, the arrangement density of the island-shaped p-i-n regions 94 is substantially uniform between the region directly under the bonding member 31 and the region other than the region directly under the bonding member 31. Thereby, the area ratio of the island-shaped p-i-n region 94 in the region directly under the bonding member 31 is greater than the area ratio of the island-shaped p-i-n region 94 in the region other than the region directly under the bonding member 31. The area ratio of the island-shaped p-i-n region 94 is highest in the region directly under the bonding member 31 and gradually decreases away from the region directly under the bonding member 31.

In other words, the conductive members 21 in the region directly under the bonding member 31 are larger than the conductive members 21 in the region other than the region directly under the bonding member 31. Therefore, the area ratio of the conductive member 21 in the region directly under the bonding member 31 is greater than the area ratio of the conductive member 21 in the region other than the region directly under the bonding member 31. According to the embodiment as well, the bonding member 31 is located in the central region of the cell region 92. Therefore, the area ratio of the conductive member 21 in the central region of the cell region 92 is greater than the area ratio of the conductive member 21 in the peripheral region of the cell region 92.

As shown in FIGS. 8A and 8B, the surge current 200 can flow more effectively in the region directly under the bonding member 31 when the forward or reverse surge current 200 is applied. In other words, one island-shaped p-i-n region 94 located in the region directly under the bonding member 31, due to it's greater size, can pass a larger current amount than one island-shaped p-i-n region 94 located in the region other than the region directly under the bonding member 31. Otherwise, the configuration, operations, and effects of the embodiment are similar to those of the first embodiment.

Third Embodiment

Figure 9:
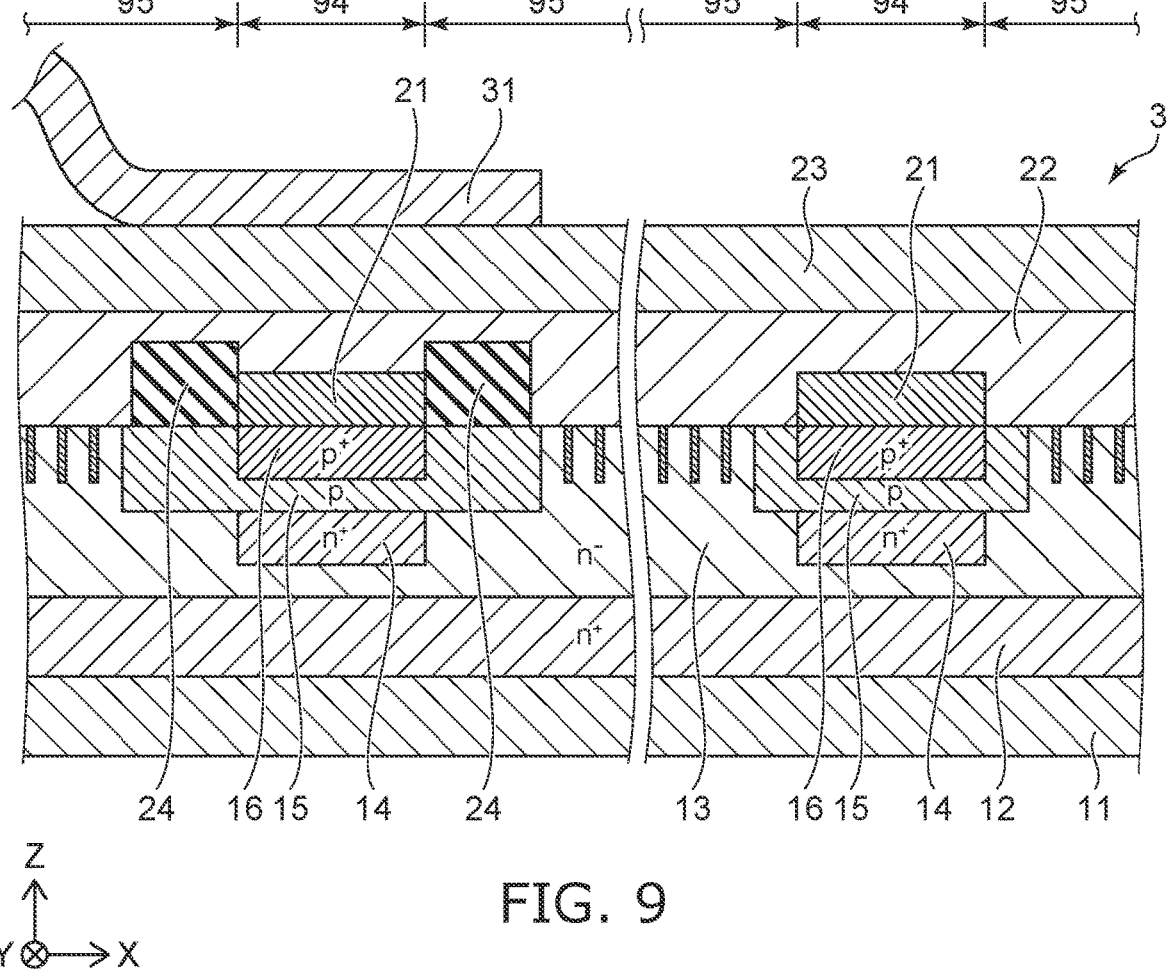
FIG. 9 is a cross-sectional view showing a semiconductor device according to a third embodiment.

FIG. 9 is a cross-sectional view showing a semiconductor device according to the embodiment.

In the semiconductor device 3 according to the embodiment as shown in FIG. 9, only one island-shaped p-i-n region 94 is located in the region directly under the bonding member 31. The island-shaped p-i-n region 94 also is located in the region other than the region directly under the bonding member 31. However, the arrangement of the island-shaped p-i-n regions 94 is not limited thereto; as in the first or second embodiment described above, multiple island-shaped p-i-n regions 94 may be provided in the region directly under the bonding member 31 and in the region other than the region directly under the bonding member 31.

An insulating member 24 is located between the p-type layer 15 and the metal layer 22 in the region directly under the bonding member 31. The insulating member 24 has a ring shape surrounding the conductive member 21 when viewed from above. Accordingly, the insulating member 24 surrounds the island-shaped p-i-n region 94 in the region directly under the bonding member 31. The insulating member 24 contacts the p-type layer 15, the metal layer 22, and the conductive member 21. The insulating member 24 is formed of, for example, an insulating material, e.g., silicon oxide, e.g., a UDO (Un-Doped Oxide). On the other hand, in the example shown in FIG. 9, the insulating member 24 may or may not be provided in the region other than the region directly under the bonding member 31.

The adhesion between the p-type layer 15 and the metal layer 22 is poor when the p-type layer 15 is formed of silicon carbide and the metal layer 22 is formed of a Schottky metal such as titanium, vanadium, etc. Therefore, when the bonding member 31 is bonded to the anode electrode 23, mechanical stress is applied to the region directly under the bonding member 31, and there is a possibility that the conductive member 21 may detach from the p-type layer 15.

According to the embodiment, the insulating member 24 is located in the region directly under the bonding member 31; and the insulating member 24 contacts the p-type layer 15 and the conductive member 21. Thereby, a strong adhesion force is realized between the p-type layer 15 and the insulating member 24 and between the conductive member 21 and the insulating member 24. The adhesion between the conductive member 21 and the p-type layer 15 also is improved thereby.

As a result, the detachment of the conductive member 21 from the p-type layer 15 can be suppressed even when mechanical stress is applied to the region directly under the bonding member 31 when the bonding member 31 is bonded to the anode electrode 23. Also, the interface between the p-type layer 15 and the conductive member 21 can be protected from all directions in the XY plane because the insulating member 24 is located in a ring shape surrounding the conductive member 21. Otherwise, the configuration, operations, and effects of the embodiment are similar to those of the first embodiment.

According to the embodiments described above, a semiconductor device can be realized in which the surge current tolerance can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A semiconductor device, comprising:

a first electrode;

a first semiconductor layer located on the first electrode, the first semiconductor layer being of a first conductivity type;

a second semiconductor layer located on a portion of the first semiconductor layer, the second semiconductor layer being of a second conductivity type;

a metal layer located on the first semiconductor layer and on the second semiconductor layer, the metal layer having a Schottky junction with the first semiconductor layer;

a second electrode located on the metal layer;

a bonding member connected to an upper surface of the second electrode; and a conductive member located between the second semiconductor layer and the metal layer, the conductive member being made of a different material from the metal layer, an area ratio of the conductive member in a region directly under the bonding member being higher than an area ratio of the conductive member in a region other than the region directly under the bonding member.

Note 2

A semiconductor device, comprising:

a first electrode;

a first semiconductor layer located on the first electrode, the first semiconductor layer being of a first conductivity type;

a second semiconductor layer located on the first semiconductor layer in a plurality of first regions, the second semiconductor layer being of a second conductivity type;

a metal layer located on the first semiconductor layer and on the second semiconductor layer, the metal layer having a Schottky junction with the first semiconductor layer in a second region;

a second electrode located on the metal layer; and a bonding member connected to an upper surface of the second electrode, an area ratio of the first region in a region directly under the bonding member being greater than an area ratio of the first region in a region other than the region directly under the bonding member.

Note 3

The device according to note 2, further comprising:

a conductive member located between the second semiconductor layer and the metal layer in the first region.

Note 4

A semiconductor device, comprising:

a first electrode;

a first semiconductor layer located on the first electrode, the first semiconductor layer being of a first conductivity type;

a second semiconductor layer located on a portion of the first semiconductor layer, the second semiconductor layer being of a second conductivity type;

a metal layer located on the first semiconductor layer and on the second semiconductor layer, the metal layer having a Schottky junction with the first semiconductor layer;

a second electrode located on the metal layer; and a conductive member located between the second semiconductor layer and the metal layer, the conductive member being made of a different material from the metal layer, an area ratio of the conductive member in a central region of a cell region being higher than an area ratio of the conductive member in a peripheral region of the cell region.

Note 5

The device according to any one of notes 1 to 4, wherein a plurality of the conductive members is provided, and an arrangement density of the conductive members in the region directly under the bonding member is greater than an arrangement density of the conductive members in the region other than the region directly under the bonding member.

Note 6

The device according to any one of notes 1 to 5, wherein a plurality of the conductive members is provided, and the conductive member located in the region directly under the bonding member is larger than the conductive member located in the region other than the region directly under the bonding member.

Note 7

The device according to any one of notes 1 to 6, further comprising:
an insulating member located in the region directly under the bonding member,
the insulating member contacting the second semiconductor layer and the conductive member.

Note 8

The device according to note 7, wherein
the insulating member has a ring shape surrounding the conductive member.

Note 9

The device according to any one of notes 1 to 8, further comprising:
a plurality of third semiconductor layers located on an other portion of the first semiconductor layer,
the plurality of third semiconductor layers being of the second conductivity type.

Note 10

The device according to note 9, wherein
the plurality of third semiconductor layers is stripe-shaped and extends in a first direction.

Note 11

The device according to any one of notes 1 to 10, wherein
the first semiconductor layer and the second semiconductor layer include silicon and carbon.

What is claimed is:

1. A semiconductor device, comprising:
a first electrode;
a first semiconductor layer located on the first electrode, the first semiconductor layer being of a first conductivity type;
a second semiconductor layer located on a portion of the first semiconductor layer, the second semiconductor layer being of a second conductivity type;
a metal layer located on the first semiconductor layer and on the second semiconductor layer, the metal layer having a Schottky junction with the first semiconductor layer;
a second electrode located on the metal layer;
a bonding member connected to an upper surface of the second electrode; and
a plurality of conductive members located between the second semiconductor layer and the metal layer, the conductive members being made of a different material from the metal layer, an arrangement density of the conductive members in a region directly under the bonding member being higher than an arrangement density of the conductive members in a region other than the region directly under the bonding member, wherein
the plurality of conductive members are arranged at a first period along a first direction and at a second period along a second direction in the region directly under the bonding member, the plurality of conductive members are arranged at a third period along the first direction and at a fourth period along the second direction in the region other than the region directly under the bonding member,
the third period is longer than the first period, and
the fourth period is longer than the second period.

2. The device according to claim 1, further comprising:
an insulating member located in the region directly under the bonding member,
the insulating member contacting the second semiconductor layer and the conductive member.

3. The device according to claim 2, wherein
the insulating member has a ring shape surrounding the conductive member.

4. The device according to claim 1, further comprising:
a plurality of third semiconductor layers located on an other portion of the first semiconductor layer,
the plurality of third semiconductor layers being of the second conductivity type.

5. The device according to claim 4, wherein
the plurality of third semiconductor layers is stripe-shaped and extends in a third direction.

6. The device according to claim 1, wherein
the first semiconductor layer and the second semiconductor layer include silicon and carbon.

7. The device according to claim 1, wherein the third period is twice the first period, and the fourth period is twice the second period.

8. A semiconductor device, comprising:
a first electrode;
a first semiconductor layer located on the first electrode, the first semiconductor layer being of a first conductivity type;
a second semiconductor layer located on the first semiconductor layer in a plurality of first regions, the second semiconductor layer being of a second conductivity type;
a metal layer located on the first semiconductor layer and on the second semiconductor layer, the metal layer having a Schottky junction with the first semiconductor layer in a second region;
a second electrode located on the metal layer; and
a bonding member connected to an upper surface of the second electrode,
an arrangement density of the first regions in a region directly under the bonding member being greater than an arrangement density of the first regions in a region other than the region directly under the bonding member, wherein
the plurality of first regions are arranged at a first period along a first direction and at a second period along a second direction in the region directly under the bonding member,
the plurality of first regions are arranged at a third period along the first direction and at a fourth period along the second direction in the region other than the region directly under the bonding member,
the third period is longer than the first period, and
the fourth period is longer than the second period.

9. The device according to claim 8, further comprising:
a conductive member located between the second semiconductor layer and the metal layer in the first region.

10. The device according to claim 8, wherein
a plurality of the conductive members is provided, and
an arrangement density of the conductive members in the region directly under the bonding member is greater than an arrangement density of the conductive members in the region other than the region directly under the bonding member.

11. The device according to claim 8, further comprising:

an insulating member located in the region directly under the bonding member, the insulating member contacting the second semiconductor layer and the conductive member.

12. The device according to claim 11, wherein the insulating member has a ring shape surrounding the conductive member.

13. The device according to claim 8, further comprising:

a plurality of third semiconductor layers located on an other portion of the first semiconductor layer, the plurality of third semiconductor layers being of the second conductivity type.

14. The device according to claim 13, wherein the plurality of third semiconductor layers is stripe-shaped and extends in a third direction.

15. The device according to claim 8, wherein the first semiconductor layer and the second semiconductor layer include silicon and carbon.

16. The device according to claim 8, wherein the third period is twice the first period, and the fourth period is twice the second period.

17. A semiconductor device, comprising:

a first electrode;

a first semiconductor layer located on the first electrode, the first semiconductor layer being of a first conductivity type;

a second semiconductor layer located on a portion of the first semiconductor layer, the second semiconductor layer being of a second conductivity type;

a metal layer located on the first semiconductor layer and on the second semiconductor layer, the metal layer having a Schottky junction with the first semiconductor layer;

a second electrode located on the metal layer; and a plurality of conductive members located between the second semiconductor layer and the metal layer, the conductive members being made of a different material from the metal layer, an arrangement density of the conductive members in a central region of a cell region being higher than an arrangement density of the conductive members in a peripheral region of the cell region, wherein the plurality of conductive members are arranged at a first period along a first direction and at a second period along a second direction in the central region, the plurality of conductive members are arranged at a third period along the first direction and at a fourth period along the second direction in the peripheral region, the third period is longer than the first period, and the fourth period is longer than the second period.

18. The device according to claim 17, wherein the first semiconductor layer and the second semiconductor layer include silicon and carbon.

19. The device according to claim 17, wherein the third period is twice the first period, and the fourth period is twice the second period.

* * * * *